United States Patent [19]

Yamashita et al.

[11] Patent Number: 4,609,615

[45] Date of Patent: Sep. 2, 1986

[54] PROCESS FOR FORMING PATTERN WITH NEGATIVE RESIST USING QUINONE DIAZIDE COMPOUND

[75] Inventors: Yoshio Yamashita; Ryuji Kawazu, both of Tokyo, Japan

[73] Assignee: Oki Electric Industry Co., Ltd., Tokyo, Japan

[21] Appl. No.: 594,481

[22] Filed: Mar. 27, 1984

[30] Foreign Application Priority Data

| Mar. 31, 1983 | [JP] | Japan | 58-53673 |
| May 2, 1983 | [JP] | Japan | 58-76203 |
| Aug. 23, 1983 | [JP] | Japan | 58-153818 |
| Aug. 23, 1983 | [JP] | Japan | 58-153819 |
| Sep. 6, 1983 | [JP] | Japan | 58-163871 |
| Dec. 19, 1983 | [JP] | Japan | 58-239295 |
| Dec. 19, 1983 | [JP] | Japan | 58-239296 |

[51] Int. Cl.$^4$ .............................................. G03F 7/26
[52] U.S. Cl. .................................. 430/325; 430/189; 430/190; 430/311; 430/320; 430/328; 430/331
[58] Field of Search ............... 430/325, 328, 331, 189, 430/326, 330, 311, 320, 190

[56] References Cited

U.S. PATENT DOCUMENTS

| 3,046,120 | 7/1962 | Schmidt et al. | 430/190 |
| 3,502,470 | 3/1970 | Delzenne et al. | 430/190 |
| 3,837,860 | 9/1974 | Roos | 430/190 |
| 4,211,834 | 7/1980 | Lapadula et al. | 430/326 |
| 4,395,481 | 7/1983 | Birkle et al. | 430/326 |
| 4,499,177 | 2/1985 | Vollanbrock et al. | 430/330 |

FOREIGN PATENT DOCUMENTS

| 45639 | 8/1980 | European Pat. Off. | 430/145 |
| 2461912 | 8/1976 | Fed. Rep. of Germany | 430/189 |
| 595694 | 2/1978 | U.S.S.R. | 430/190 |

OTHER PUBLICATIONS

Pacansky, J., et al, *IBM J. Res. Develop.*, vol. 23, No. 1, 1/1979, pp. 42–51.
DeForest, W. S., *Photoresist Matl's and Processes*, McGraw-Hill Book Co., 1975, p. 105.

*Primary Examiner*—Charles L. Bowers, Jr.
*Attorney, Agent, or Firm*—Wenderoth, Lind & Ponack

[57] ABSTRACT

A process for forming patterns with a negative type resist which comprises the steps of forming a negative type resist film made of quinone diazide oligomer having a polymerization degree of 10 or less, such as a quinone diazide sulfonic ester on a substrate, irradiating the resist film selectively with far ultraviolet rays having a wavelength of 180–300 nm to expose the above film, and then developing the film thus exposed by the use of a suitable developer such as a solution containing any one of an acetic ester, an alkyl ketone and cyclohexanone, and another process wherein the above described exposing step is carried out in such a manner that the quinone diazide sulfonic ester film is subjected to blanket exposure by means of ultraviolet rays having a longer wavelength than 300 nm, and then the resist film, thus exposed, is further subjected to selective exposure by means of far ultraviolet rays of 300 nm or less.

5 Claims, 3 Drawing Figures

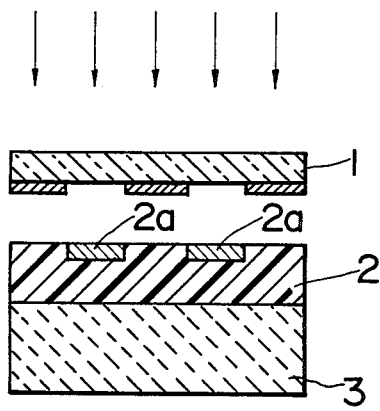
FIG_1
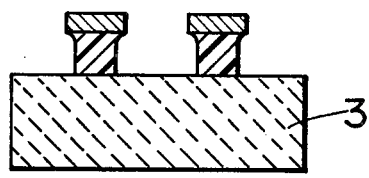
FIG_2

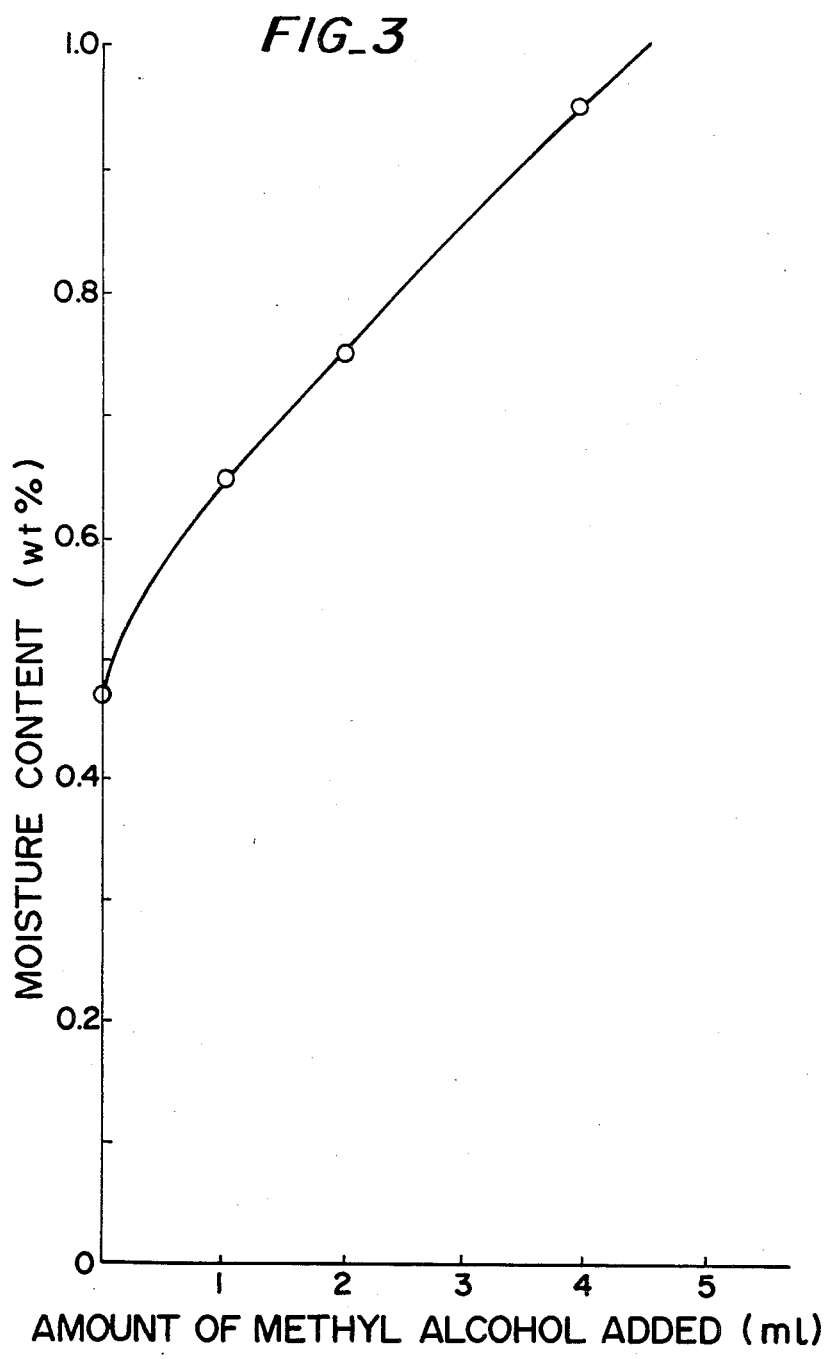

PROCESS FOR FORMING PATTERN WITH NEGATIVE RESIST USING QUINONE DIAZIDE COMPOUND

BACKGROUND OF THE INVENTION

1. Field of the Invention

This invention relates to a process for forming fine patterns with a negative resist suitable for fabrication of semiconductors, magnetic bubble elements, light applied components and the like.

2. Description of the Prior Art

Recently there have been increasing severe demands for high integration of semiconductor integrated circuits and the like. In this connection, light having shorter wavelength than that of conventional one (particularly, ultraviolet rays) such as electron beam, X-rays, far ultraviolet rays or the like has been utilized in place of such conventional light in the field of lithography.

Especially, the lithographic technique wherein such far ultraviolet rays as mentioned above are utilized is not only extension technique of conventional photolithography, but also a technique wherein submicron transfer becomes easily possible. Thus, such lithographic technique may be much expected for future fine workings. These fine workings may be classified into etching method and lift-off method.

In case of lift-off method, severe conditions such as a suitable profile in resist film, thermal resistance, solubility, adhesive properties and the like are required in respect of a resist to be used. More specifically, it is necessary for easy pattern formation in accordance with lift-off method that a layer applied on the resist film can easily be removed together with solution of the resist. For this reason, it is required that a profile of the resist film patterned must be in overhung form.

In order to obtain such overhung form, either a means for forming a multi-layer construction of resist, or a means for treating a positive type photoresist, e.g., AZ-1350J (trade name of photoresist manufactured by Shipley Co.) with chlorobenzene is adopted at present. However, these means are complicated and inferior in the throughput, and the reproducibility thereof is not necessarily favorable.

SUMMARY OF THE INVENTION

In view of the above circumstances, the present inventors have examined and studied repeatedly in order to comply with the above-mentioned requirements. As a result, it was found that when a film of a polymer containing quinone diazide was formed on a substrate, followed by irradiation with far ultraviolet rays, and subsequently developed by a solution containing acetic ester, alkyl ketone or cyclohexanone, resist patterns of favorable resolving power having remarkably improved dry etching resistance as well as thermal resistance can be formed with high sensitivity. Further, the profile of the resulting resist patterns exhibited an overhang form.

In addition to the above, it was also discovered that a solution prepared by adding water to any acetic ester or cyclohexanone developers was suitable for developing the photoresist materials of the present invention.

Accordingly, it is an object of the present invention to provide a resist material which is highly sensitive with respect to far ultraviolet rays, and has high resolution, high dry etching resistance as well as high thermal resistance, whereby such an overhang as mentioned above can be formed by only a developing treatment. Also a process for forming resist patterns possessing the above excellent properties is provided herein by the use of the aforesaid resist material.

It is another object of the present invention to provide a process for forming patterns, the profile of which can be obtained in an overhung form, in the order of submicron, and at the same time which have high sensitivity and high resolution. Further, no cracks are found on the resist film of the patterns of the present invention after the development.

It is still another object of the present invention to provide a process for forming patterns with a resist for a lift-off method which is excellent in throughput and exhibits favorable reproducibility, the process being carried out in such a way that a resist film is subjected to blanket exposure by means of, for example, ultraviolet rays having a longer wavelength than 300 nm, and thereafter the resulting resist film is further subjected to selective exposure by the use of far ultraviolet rays of 300 nm or less, whereby said patterns are obtained.

These and other objects will become apparent from the following detailed description including specific examples taken in connection with the accompanying drawings.

BRIEF DESCRIPTION OF THE DRAWINGS

FIG. 1 is a schematic view showing a reaction region of light in the case where far ultraviolet irradiation is made in accordance with the present invention;

FIG. 2 is a schematic view showing resist patterns after the development thereof; and FIG. 3 is a graphic representation in which amount (ml) of methyl alcohol added to a developer is plotted as the abscissa and the moisture content (wt%) relating thereto as the ordinate.

DETAILED DESCRIPTION OF THE INVENTION

The aforesaid objects of the present invention are attained by the steps of exposing a resist film to far ultraviolet rays, developing the resist film thus exposed to form resist patterns, and thereafter subjecting the whole surface of a substrate involving the aforesaid resist patterns to blanket irradiation with ultraviolet rays prior to application of a layer to be patterned.

In the present invention, naphthoquinone-1,2-diazide-5-sulfonic ester (hereinafter referred to simply as "LMR") of a novolak resin having a polymerization degree of 10 or less is suitably used as a resist material as described in the under-mentioned examples. In this connection, benzoquinone diazide, naphthoquinone diazide and the like are known as quinone diazide groups and any of them may be employed in the present invention to obtain the same effects.

The aforesaid LMR has 10 times or higher sensitivity than that of PMMA with respect to far ultraviolet rays so that submicron transfer is possible, and the resist patterns obtained therefrom are excellent in dry etching resistance. Further, no sags are observed on such patterns even at a baking temperature of about 200° C. In addition, overhung form in patterns can be obtained by the use of the resist material of LMR with only a developing treatment. In brief, the aforesaid LMR may suitably be utilized as both a resist for dry etching and a resist for a lift-off method in accordance with far ultraviolet lithography.

The mechanism for favorably forming negative resist patterns by means of far ultraviolet rays, according to the present invention as described above, may be considered as follows.

As is apparent from the undermentioned Comparative Example 3, and the like, quinone diazide in LMR turns to indene carboxylic acid by means of ultraviolet irradiation, and positive type patterns are formed by the further use of a well-known AZ developer. In this type of light irradiation reaction, however, patterns cannot be formed even if acetic ester is utilized as the developer.

In other words, the reaction due to far ultraviolet rays differs from the reaction by means of ordinary ultraviolet irradiation.

It may be that the resist of a part irradiated with far ultraviolet rays in the present invention is subjected to structural change so that such part becomes insoluble in acetic ester or the like to obtain patterns. More specifically, although the resist is a negative resist, formation of patterns thereof is not conducted in accordance with a cross-linking reaction so that there is no swelling of patterns and as a result, the resultant patterns exhibit significantly high resolving power.

Furthermore LMR is a kind of oligomer, and the low molecular weight thereof contributes to the high resolving power of the patterns.

Further, the reason why an overhung form in patterns can be obtained by the above described development is becase the aforesaid LMR possesses strong absorption in the far ultraviolet region, light does not reach deeply into the patterns so that only the surface layer thereof becomes insoluble as illustrated in FIG. 1, and upon development of such patterns, the overhung form thereof can be obtained as shown in FIG. 2. In FIGS. 1 and 2, reference numeral 1 designates a mask, 2 the LMR layer, 3 a substrate, and 2a a reaction region, respectively.

On the one hand, LMR is a compound in which quinone diazide is combined with a novolak by means of sulfonic acid, and it may be considered from, for example, Comparative Example 4 that the structural change is not effected by reaction of novolak, but is effected by that of quinone diazide group with the irradiation of far ultraviolet rays. Thus, the polymer which can be utilized in the present invention is required to involve quinone diazide group, and further to be soluble in acetic ester, alkyl ketone, cyclohexanone or the like.

When each prescribed amount of water and alcohol is added to the aforesaid developer, more favorable patterns with no cracks can be obtained.

In the case where a developer containing no water and alcohol is used, it is observed that sometimes cracks are liable to appear particularly on the periphery of the window pattern, further, the finer the window pattern and the thicker the resist thickness the more remarkable the production of cracks.

Since vapor deposition and the like of metal are significantly adversely affected by the cracks thus produced, it is necessary to suppress such occurrence of cracks as much as possible. As a measure for such suppression, it may be considered that the resist to be thinner, but such a thin resist is not practical, if the thickness of the metal in metal wiring patterns is taken into consideration. In this respect, the occurrence of such cracks can be prevented by merely adding water and alcohol to a developer to be used in accordance with the invention. Because such developer contains water other than alcohol, the developer can prevent production of cracks. If there is only methanol, the prevention of cracks cannot be attained.

For instance, the developer described in the undermentioned Example 12 exhibits a low solubility of water so that the saturation content of water is 0.46% in the developer. Such a content of water will be described in more detail hereinbelow.

FIG. 3 is a graphic representation indicating a characteristic curve wherein the moisture content in a developer is plotted as an ordinate in wt% with respect to the amount (ml) of methyl alcohol added, plotted as the abscissa, in the case where 2 ml of water is added to 100 ml of the developer consisting of 10 isoamyl acetate and 2 cyclohexane in volume ratio, and methyl alcohol is further added to the resultant mixture. As is understood from the characteristic curve, when methanol is added to the developer, the moisture content in the developer increases. More specifically, when 4 ml of methanol is added to 100 ml of the developer, the moisture content reaches 0.97% by weight. From this experiment, it may be deduced that when the moisture content in the developer increases due to the addition of methanol thereto, the production of cracks can be prevented in a thicker resist film in response to such increase of the moisture content. Originally, water can prevent occurrence of cracks so that methanol functions only to increase moisture content in a developer. For this reason, alcohol is not limited to methanol for attaining such purpose as described above, but ethanol, isopropanol and the like may also be employed.

Then, when the resist film is heated at a temperature of 50°–120° C. prior to the development, the dry etching resistance as well as the thermal resistance of the resulting resist patterns are improved, and further patterns of favorable resolving power can be formed with high sensitivity.

The high sensitivity of the resist patterns due to heating is supposed to be based on the fact that the reaction does not proceed completely so that 100% of the final product (insoluble in isoamyl acetate) is obtained by irradiation above with far ultraviolet rays, but the product remains in a state of an intermediate (insoluble in amyl acetate), and such intermediate does not shift to the final product until the former is heated.

The lower limit of the temperature conditions for such heating as described above is about 50° C., while patterns cannot be obtained at temperatures exceeding the upper limit, for example, 130° C. This is because there arises thermal crosslinking due to decomposition of the quinone diazide group at a temperature of 130° C. or more in the LMR so that such LMR becomes insoluble in the solvent.

In the present invention, the heating after exposure is carried out at a temperature of 50°–120° C. as described above, and particularly 80°–110° C. is preferable.

In order to attain the above objects of the present invention, the exposure is conducted in such a manner that first, a resist film is subjected to a blanket exposure by means of ultraviolet rays having a longer wavelength than 300 nm and then, the resist film, thus blanket-exposed to ultraviolet rays, is subjected to selective exposure again by means of far ultraviolet rays of 300 nm or less with the utilization of a mask for forming patterns, and thereafter the resist film thus exposed twice is developed.

Due to the blanket exposure by means of the aforesaid ultraviolet rays, the quinone diazide group is decomposed, and the decomposed product exhibits an absorptivity coefficient of 8 $\mu m^{-1}$ at a wavelength of 250 $\mu m$, while the absorptivity coefficient of LMR itself is 12 $\mu m^{-1}$, at the same wavelength, so that the absorptivity of the decomposed product is lower than that of the LMR. Hence, the transmission of the LMR becomes more favorable in the far ultraviolet region because of the aforesaid ultraviolet irradiation. Following the ultraviolet irradiation, when selective irradiation is conducted with far ultraviolet rays through a mask, such far ultraviolet rays reach a deep position of the resist film below the surface thereof so that such resist film becomes insoluble in the developer. For this reason, in case of the development, the amount of the overhung resist patterns decreases, pattern shortage does not occur, and further there is no swelling of the patterns due to the development in the decomposed LMR. Thus favorably fine patterns can be obtained, even if the resist film is thick. Moreover, since LMR becomes very soluble in an organic solvent, such as acetone or the like, by means of ultraviolet irradiation at a lower wavelength than 300 nm, an inexpensive organic solvent such as acetone may be used in case of employing a off process.

The amount of exposure by far ultraviolet rays in the present invention is about three times or higher than that where no ultraviolet irradiation is carried out, but the throughput and the like are not substantially affected adversely by such an extent of exposure amount.

The object of the present invention is further attained by subjecting a region to be left as the above-mentioned resist patterns to selective exposure with far ultraviolet rays at a wavelength of 200–300 nm, while subjecting the region to be removed to exposure by means of ultraviolet rays having a wavelength longer than 300 nm.

In other words, after formation of an applied layer of the resist film, selective exposure is respectively carried out by the use of the patterns reversed to each other by means of far ultraviolet rays as well as ultraviolet rays, and thereafter a developing treatment may be conducted. Accordingly, the treatment therefor is simple, the throughput is excellent, and the reproducibility is also favorable.

Furthermore there is another advantage in that when a substrate is heated at the time of application of a layer to be applied, the adhesive properties of the resist, as well as the layer applied, are improved with respect to the substrate because of the excellent thermal resistance of the resist material.

The process for forming patterns according to the present invention utilizes such phenomena that the resist is made to be insoluble (negative) in the developer by means of selective irradiation with far ultraviolet rays, the rate of dissolution of the resist is accelerated by means of ultraviolet irradiation, the light absorption of the resist is noticeable in the wavelength region of the far ultraviolet rays so that light permeates only such an area extending immediately under the surface layer of the resist, and light reaches the surface of the substrate in the wavelength region of, the ultraviolet rays, even if the resist film is thick. Therefore it is apparent that the process according to the present invention may be applied to any resist material which exhibits such phenomena as enumerated above, and the same excellent advantages with those mentioned above can also be attained by such pertinent resist materials.

The present invention will be more specifically described hereinbelow in conjunction with the following examples.

EXAMPLE 1

LMR was dissolved in methyl cellosolve acetate, and the resulting solution was applied to a silicon substrate with a thickness of 0.5 $\mu m$ in accordance with a spin coating method. The substrate thus applied was baked at 60° C. for 30 minutes, and subjected to contact exposure for 10 seconds by means of a 500 W Xe-Hg lamp. After the exposure, the so-treated substrate was developed for 20 seconds by using isoamyl acetate to obtain negative resist patterns of 0.5 $\mu m$ line-and-space.

When the resulting patterns were observed by a scanning type electron microscope (hereinafter referred to simply as "SEM"), the profile of the resist patterns exhibited an overhung form.

EXAMPLE 2

The resist patterns obtained in Example 1 were heated at 200° C. for 30 minutes, and observed by means of SEM. As a result, no deformation such as sags or the like, was observed on the resist patterns which were equivalent to those prior to the heating.

EXAMPLE 3

Exposure was carried out in accordance with the same manner as that of Example 1, and the resulting resist patterns were developed for 30 seconds by the use of isoamyl acetate. The patterns developed were observed by means of SEM. As a result, a profile of the patterns having a larger overhung form than that of Example 1 was observed.

EXAMPLE 4

A film was formed on a substrate from LMR in accordance with the same manner as that of Example 1, and dry etching resistance thereof was examined in case of using oxygen plasma, wherein a parallel plate type etching device was used to carry out etching for 15 minutes at 0.08 W/cm$^2$ output density, 20 SccM O$_2$ gas flow rate, and 50 pa gas pressure. As a result, the etching amount was 50 nm, and for comparison, another etching was carried out under the same conditions, except that PMMA was employed, the etching amount of which was 200 nm.

COMPARATIVE EXAMPLE 1

LMR was exposed in accordance with the same manner as that of Example 1, and developed by utilizing an AZ-1350J exclusive developer for 60 seconds. As a result, no patterns were formed.

COMPARATIVE EXAMPLE 2

PMMA was applied on a silicon substrate with a thickness of 0.5 $\mu m$, and prebaked at 180° C. for 30 minutes. Thereafter, the substrate thus prebaked was exposed by utilizing the same device as that of Example 1 for 60 seconds and 120 seconds, respectively, and the substrates thus exposed were developed by the use of MIBK. As a result, patterns were obtained in the case of a 120 seconds exposure, while no patterns were obtained in a 60 seconds exposure.

COMPARATIVE EXAMPLE 3

LMR formed by the same manner as that of Example 1 was exposed by utilizing a mask aligner provided with 250 W mercury-arc lamp for 30 seconds, and developed by means of AZ-1350J developer to obtain positive type patterns. On the other hand, as a result of the development by the use of isoamyl acetate, the whole surface of the film was dissolved therein to obtain no patterns.

EXAMPLE 5

LMR exposed in accordance with the same manner as that of Example 1 was developed by using methyl isoamyl ketone for 20 seconds. As a result, resist patterns of 0.5 μm were obtained.

EXAMPLE 6

LMR exposed in accordance with the same manner as that of Example 1 was developed by means of a 5:2 mixed solution of n-propyl acetate and cyclohexane. As a result, resist patterns of 0.5 μm were obtained.

EXAMPLE 7

LMR exposed in accordance with the same manner as that of Example 1 was developed by means of a 5:1 mixed solution of isopropyl acetate and isopropyl alcohol. As a result, resist patterns of 0.5 μm were obtained.

COMPARATIVE EXAMPLE 4

A Novolak resin was dissolved in methyl cellosolve acetate, and the resulting solution was applied to a substrate with a thickness of 0.5 μm, and prebaked at 100° C. for 30 minutes. Exposure was carried out according to the same manner as that of Example 1, and thereafter the so-treated substrate was developed by the use of isoamyl acetate. However, no patterns were formed on the substrate.

EXAMPLE 8

LMR was dissolved in methyl cellosolve acetate, the resulting solution was filtered with a filter of 0.2 μm, and then applied on a silicon substrate with a thickness of 0.6 μm to form a film, i.e., resist film. Thereafter, the substrate provided with the resist film was subjected to heat-treatment (prebaking) at a temperature of 60° C. for 30 minutes, and then the resulting resist film was exposed principally by means of far ultraviolet rays of 180–300 nm derived from 500 W Xe-Hg lamp through a mask contacted closely to the resist film for 5, 8 and 10 seconds, respectively. Thereafter, these samples were heat-treated at 100° C. for 30 minutes, and these resist films were developed with a solvent containing cyclohexanone, i.e., a mixed solution prepared by adding 3 cyclohexane to 2 cyclohexanone in volume ratio for 20 seconds to form patterns. As a result, it was confirmed that 0.5 μm line-and-space patterns were sufficiently resolved in respect to the above resist films. Further, it was confirmed that a profile of each resist film forming the resulting resist patterns exhibited an overhung form.

EXAMPLE 9

In the present example, exposure was conducted in the same manner as that of Example 8, except that the thickness of LMR resist film was 1.2 μm and the exposure time was 10 seconds. After the exposure, the substrate with the resist film was heated at 100° C. for 30 minutes, and then developed with a mixed solution prepared by adding 0.002 water to 1:1 admixture of cyclohexanone and cyclohexane in a volume ratio for 15 seconds to form patterns. As a result, 0.5 μm space patterns were obtained. In addition, it was confirmed that no cracks were produced in the resist film with the resulting resist patterns.

EXAMPLE 10

In the present example, a resist film was formed, heated and exposed in accordance with the same manner as that of Example 8, then heated at 100° C. for 30 minutes, and thereafter developed with a mixed solution prepared by adding 4 isopropyl alcohol to 2 cyclohexanone for 20 seconds to form patterns. As a result, 0.5 μm line-and-space resist patterns were obtained.

EXAMPLE 11

In the present example, formation, heating (prebaking), and exposure of a film were conducted in the same manner as that of Example 8 except that naphthoquinone-1,2-diazide-5-sulfonic ester of vinyl phenol having a polymerization degree of 10 or less was used as a resist material, and exposure time was 20 seconds. Thereafter, heat treatment was conducted at 100° C. for 30 minutes, and development was then carried out by the use of a mixed solution prepared by adding 2 cyclohexane to 1 cyclohexanone in volume ratio for 20 seconds to form patterns. As a result, 0.75 μm line-and-space patterns were obtained.

In the above-mentioned respective Examples 8–11, the developing temperature was 23° C.

As is apparent from the experimental results of these examples, a part of the LMR which has been irradiated with far ultraviolet rays is subjected to structural change. As a result, such LMR becomes insoluble in a solvent containing cyclohexanone, whereby negative type resist patterns can be obtained. In case of the present invention, however, as is clear from such fact that resist patterns developed dissolve into dimethylformamide, the part which had been irradiated with far ultraviolet rays has not completely gelled.

Furthermore it has been confirmed that when such solvent containing cyclohexanone used as a developer for the resist is applied, the ratio of dissolution velocity between an exposed portion and an unexposed portion of the resist film may be set with high allowance, and at the same time the exposed portion does not swell. Thus, when resist patterns are formed by means of such developer as mentioned above, the resist layers adjacent to each other do not adhere therebetween so that high resolution can be attained, whereby fine working of the resist patterns becomes possible in the submicron order.

EXAMPLE 12

LMR having a polymerization degree of 10 or less was dissolved in methyl cellosolve acetate, and the resulting solution was applied on a silicon substrate in accordance with spin coating method to form a resist film having a thickness of 2 μm. Then, the substrate provided with the resist film was subjected to heat treatment (prebaking) in a nitrogen atmosphere at a temperature of 60° C. for 30 minutes, and thereafter exposed principally by means of far ultraviolet rays of 180–300 nm derived from 500 W Xe-Hg lamp for 10 seconds in accordance with a contact method in which a mask is closely contacted with the resist film. The resulting sample was then subjected to heat treatment in a nitrogen atmosphere at a temperature of 100° C. for 30 minutes, and thereafter the resist film was developed by the use of a well agitated solution which had been obtained by adding 2 ml of water and 2 ml of methyl alcohol to 100 ml of a developer (mixed solvent) prepared by adding 2 cyclohexane to 10 isoamyl acetate in volume ratio. In this case a temperature of the solution was 23° C. and a period of development was 15 seconds. As a result of the development for forming patterns, it was confirmed that the patterns of 0.75 μm, i.e., those of a submicron order could be obtained, the profile of which exhibited an overhung form, and in addition, more favorable thermal resistance, solubility and adhesive properties of the resist film could be obtained than those of a conventional resist film. Furthermore, it was also confirmed that no cracks were produced on the resist film on which the patterns had been formed after the development.

EXAMPLE 13

A resist film was exposed in the same manner as that of Example 12, and then heated in a nitrogen atmosphere at a temperature of 100° C. for 30 minutes. Then a solution obtained by adding 2 ml of water and 3 ml of methyl alcohol to 100 ml of a developer prepared by adding 3 cyclohexane to 2 cyclohexanone in volume ratio (in this case, the temperature of the solution being 23° C.) was well agitated, and the resist film heated as described above was developed with the aforesaid solution to form patterns. As a result, 0.5 μm space patterns were obtained. Further it was confirmed that the profile of the resist film provided with the resulting resist patterns exhibited an overhung form, and no cracks were observed in the resist film. In this case also, the resist film had more favorable thermal resistance, solubility, and adhesive properties than those of a conventional resist film.

COMPARATIVE EXAMPLE 5

A resist film obtained by exposing the film in the same manner as that of Example 12 and then subjecting the film to heat-treatment in a nitrogen atmosphere at a temperature of 100° C. for 30 minutes a was utilized as a sample. On the one hand, a solution was obtained by adding 2 ml of water only to 100 ml of a developer prepared by adding 2 cyclohexane to 10 isoamyl acetate in volume ratio (in this case also, the temperature of the solution being 23° C.), the resulting solution was sufficiently stirred, and the aforesaid sample was developed by means of this solution. As a result, 0.75 μm patterns were obtained. In this case, however, it was confirmed that some cracks were produced on peripheral portions of the patterns.

EXAMPLE 14

LMR was dissolved in methyl cellosolve acetate, filtered with 0.2 μm filter, and applied on a Si substrate with a thickness of 0.6 μm. The substrate with the resulting film was baked at 60° for 30 minutes, and exposed by means of 500 W Xe-Hg lamp in accordance with a contact method for 3, 5 and 10 seconds, respectively.

Each of these substrates with the film exposed was heated at 100° C. for 30 minutes, and developed by the use of isoamyl acetate (to which 0.1% of water had been added). As a result, it was found that 0.5 μm line-and-space patterns of all the samples in the aforesaid amounts of exposure 3, 5 and 10 seconds had been sufficiently resolved. Further, a profile of the resultant resist of each sample exhibited an overhung form.

COMPARATIVE EXAMPLE 6

The same exposure was carried out as in Example 14, and immediately after the exposure, development was conducted by means of the same developer as that of Example 14. As a result, patterns could be formed in case of a 10 second exposure, while no patterns could be obtained in cases of 3 second and 5 second exposures.

EXAMPLE 15

The same exposure was carried out as in Example 14, the samples were heated at 50° C. and 130° C. for 30 minutes, and the same development was conducted in accordance with the same manner as that of Example 14. As a result, the sample in case of 50° C. heating could be resolved at 5 second and 10 second exposures whilst resolution was insufficient at 3 second exposure. In the sample in case of 130° C. heating, all the patterns did not dissolve in the developer so that no patterns could be obtained.

EXAMPLE 16

LMR was dissolved in methyl cellosolve acetate, and the resulting solution was applied on a silicon substrate with a thickness of 1 μm to form a resist film.

Then, the substrate provided with the resist film was subjected to heat treatment (prebaking) at a temperature of 60° C. for 30 minutes, and thereafter an initial exposing step was conducted. In this exposing step, the resulting resist film was subjected to blanket irradiation with ultraviolet rays of only more than 300 nm, preferably 350–450 nm, which were obtained by cutting out the light having wavelengthes of 300 nm and shorter ones in the light derived from 250 W Hg lamp for 60 seconds.

For pattern formation, the resist film exposed initially was subjected to selective exposure in such a manner that only the portions to be left as resist patterns were irradiated with far ultraviolet rays of 200–300 nm from 500 W Xe-Hg lamp through a mask according to a contact method for 30 seconds.

After the selective exposure, baking was conducted at 100° C. for 30 minutes. Thereafter, the resulting resist film was developed by means of a solution prepared by saturating a mixture of 10 isoamyl acetate and 5 cyclohexane in volume ratio with water for 30 seconds, and in this case, a temperature of the development was 23° C.

As a result of observation of the resulting resist patterns with SEM, it was confirmed that 0.5 μm line-and-space as well as 0.5 μm line patterns could be obtained. It was also confirmed that a profile of the resist film forming such resist patterns exhibited an overhung form.

Next, a layer to be applied, e.g., an Al layer was evaporated to a thickness of 1 μm on the substrate on which the resist patterns had been formed in accordance with a vacuum deposition method. When the substrate with the Al layer was immersed in an organic solvent, e.g., acetone solution, lift-off was completely performed and 0.5 μm line-and-space Al patterns could be obtained.

COMPARATIVE EXAMPLE 7

After the application and formation of the same resist film as that of Example 16 on a substrate, selective exposure was directly carried out for pattern formation with far ultraviolet rays of 200–300 nm from 500 W Xe-Hg lamp through a mask for 10 seconds without accompanying exposure in accordance with blanket irradiation with ultraviolet rays from an Hg lamp being the exposing step according to the present invention. Thereafter, the same baking as that of the above-mentioned examples of the present invention was conducted at 100° C. for 30 minutes, and the resulting sample was then developed by the use of similar developing solution to that mentioned above (a solution prepared by saturating a mixture of 10 isoamyl acetate and 2 cyclohexane in volume ratio with water) for 20 seconds. By observing the resulting resist patterns with SEM, it was confirmed that 1 μm line-and-space patterns were obtained, but 0.5 μm line-and-space patterns as well as 0.5 μm line resist patterns could not be obtained.

EXAMPLE 17

LMR was dissolved in methyl cellosolve acetate, and the resulting solution was applied on a silicon substrate with a thickness of 2 μm to form a resist film. Then, the substrate with the resist film was heat-treated (prebaked) at a temperature of 60° C. for 30 minutes, and thereafter the resist film, thus heat-treated, was selectively exposed through a mask by means of far ultraviolet rays of 200–300 nm derived from 500 W Xe-Hg lamp for 5 seconds thereby to form a region irradiated with far ultraviolet rays.

Next, after the removal of the above described mask, a reverse mask to the former was applied, through which selective exposure was conducted by the use of ultraviolet rays having a longer wavelength than 300 nm derived from an extra-high pressure Hg lamp for 60 seconds, thereby to form a region irradiated with ultraviolet rays. In this case, with the increase of irradiation dose of ultraviolet rays, solubility in the region irradiated with ultraviolet rays was improved with respect to the developer used, and such irradiation effect with ultraviolet rays appeared after the irradiation for several seconds and reached saturation for about 60 seconds. Hence, even if such irradiation was continued for a long period of time such as 5 minutes and 10 minutes, the rates of dissolution in these long-term irradiations were substantially identical to that in case of 60 second irradiation, so that neither an advantage nor a disadvantage due to long-term irradiation was observed.

Then the resulting sample was heat-treated at a temperature of 100° C. for 30 minutes, and thereafter the resist film, thus heat-treated was developed by utilizing a solution prepared by saturating a mixture of 10 isoamyl acetate and 5 cyclohexane in volume ratio with water at a solution temperature of 23° C. for 60 seconds.

By observing the resulting resist patterns with SEM, it was confirmed that the patterns exhibited a profile of favorable overhung form. Further it was confirmed that 0.5 μm line-and-space patterns and 0.5 μm line patterns could be obtained.

Next, for example, Al was evaporated with a thickness of 1.5 μm on the surface of the substrate involving such resist patterns as mentioned above in accordance with vacuum deposition method. The resulting sample was then immersed in an organic solvent, e.g., acetone solution to effect lift-off. When the results were observed by means of SEM, it was confirmed that the lift-off was completely performed, and 0.5 μm line-and-space patterns as well as 0.5 μm line patterns were obtained.

COMPARATIVE EXAMPLE 8

The same resist film as that of Example 17 was selectively exposed through a mask by means of far ultraviolet rays of 200–300 nm derived from 500 W Xe-Hg lamp for 5 seconds without accompaying irradiation with ultraviolet rays derived from such an extra-high pressure Hg lamp as in Example 17. This was followed by heat treatment of the resulting sample at a temperature of 100° C. for 30 minutes, and thereafter development was conducted by using a solution prepared by saturating a mixture of 10 isoamyl acetate and 2 cyclohexane in volume ratio with water.

When the results were observed by means of SEM, it was found that 1.5 μm line-and-space patterns were obtained, while it was confirmed that resolution in the submicron order, in other words, 0.5 μm and 1 μm line-and-space patterns could not be obtained.

EXAMPLE 18

LMR was dissolved in methyl cellosolve acetate, and the resulting solution was applied on a silicon substrate with a thickness of 0.7 μm to form a film, i.e., a resist film. Thereafter the substrate provided with the resist film was heat-treated (prebaked) at a temperature of 60° C. for 30 minutes, and the resist film, thus heat treated, was exposed with the use of a mask by means of far ultraviolet rays of principally 200–300 nm from a 500 W Xe-Hg lamp for 10 seconds. Then the resulting resist film was developed by utilizing an isoamyl acetate solution (containing 1 isoamyl acetate: 0.2 cyclohexane: 0.001 water in volume ratio) for 30 seconds. As a result, 0.5 μm space resist patterns were obtained, and further it was confirmed that the profile of the resist film forming the resist patterns exhibited an overhung form. Next, the resulting sample was subjected to blanket irradiation with ultraviolet rays of principally 350–450 nm derived from 250 W extra-high pressure Hg lamp for 2 minutes, and in this case, output of 300 nm or less was cut out by means of a lens system. No deformation of patterns due to the irradiation was observed. After the irradiation with ultraviolet rays, the substrate was heated at a temperature of 150° C. to perform a heat treatment, on which a material to be applied, for example, Ni, which metal is difficult to evaporate, was evaporated to a thickness of 0.3 μm. Thereafter, lift-off was carried out by the use of dimethylformamide, and as a result, 0.5 μm width Ni patterns could be obtained.

COMPARATIVE EXAMPLE 9

The patterns formation of a resist film was conducted in accordance with the same manner as that of Example 18, and the substrate was heated in the same manner as that of Example 18 without carrying out ultraviolet irradiation by means of an Hg lamp thereby performing an Ni vapor deposition. This was followed by immersion of the resulting sample, obtained in the same manner as that of Example 18, into dimethylformamide, the resist did not dissolve, and therefore no Ni patterns were obtained.

COMPARATIVE EXAMPLE 10

The pattern formation of a resist film was conducted in accordance with the same manner as that of Example 18, and this time Ni was evaporated to perform lift-off without carrying out both ultraviolet irradiation and heating of the substrate. As a result, it was confirmed by microscopic examination, that there was exfoliation in the resist.

Example 18 as well as Comparative Examples 9 and 10 will be studied hereinbelow.

As was already mentioned, LMR has high resolution with respect to ultraviolet rays and can form an overhung form. Furthermore, since such LMR has a quinone diazide group, a crosslinking reaction arises when the LMR is heated at a temperature of 130° C. or more. In the present invention, however, since the resist is irradiated with ultraviolet rays of 350–450 nm after the formation of the resist patterns, the quinone diazide group causes photochemical decomposition due to such ultraviolet irradiation so that no crosslinking reaction is caused, even if such resist is heated further. Thus the resist is dissolved in dimethylformamide to easily perform lift-off, even though heat treatment has been completed at 150° C.

In Comparative Example 9, since the resist is not irradiated with ultraviolet rays within a region of the wavelength as mentioned above, the quinone diazide group causes a crosslinking reaction due to the heat treatment at a temperature of 150° C. so that the resist becomes insoluble in dimethylformamide, and accordingly lift-off cannot be performed by means of such resist.

Furthermore, in Comparative Example 10, since Ni is evaporated without heating the substrate, the Ni shrinks at the time of vacuum deposition to produce stress, whereby adhesive properties between the substrate and the resist deteriorate so that it may be considered that the resist exfoliates at the time of vacuum deposition.

Meanwhile, thermal crosslinking of quinone diazide in LMR is caused at a temperature of 120° C. or more, and in the case where the quinone diazide group is subjected to photochemical decomposition by means of ultraviolet rays, the resist is dissolved in dimethylformamide even if the resist has been heat-treated at a temperature of 170° C. It was confirmed, however, from experiments that if the temperature rose further, adhesion between the resist and the substrate became rigid so that the resist hardly exfoliates from the substrate. Further it was also confirmed that an overhung form of the resist of LMR was not damaged by even heat treatment at a temperature of 170° C.

Moreover it was experimentally confirmed that adhesive properties of the resist with respect to the substrate were also improved because of heating the substrate, so that there was no fear of invasion of a material to be applied in a gap between the resist layer and the substrate at the time of vacuum deposition, and therefore beautiful and sharp applied layer patterns could be obtained.

As described above, even if the resist is heated up to 170° C., the lift-off thereof is possible, while the adhesive properties between the resist and the substrate are improved and at the same time, the adhesive properties between the substrate and the material to be applied are also improved because the substrate is heated at the time of application of the material to be applied.

In the present invention, as is apparent from the above description, a high reslution of patterns is achieved which are excellent in dry etching resistance and thermal resistance can be transferred with high sensitivity by utilizing far ultraviolet rays. Further, resist patterns having an overhung profile can be formed by development so that the invention is applicable for fabrication of highly compacted semiconductor components and magnetic bubble elements, and therefore the industrial value of the present invention is extremely high.

What is claimed is:

1. A process for forming patterns with a negative type resist consisting essentially of the steps of:

forming, on a substrate, a negative type resist film made of a quinone diazide sulfonic ester of a novolak resin having a polymerization degree of 10 or less;

selectively irradiating the thus-formed film with far ultraviolet rays having a wavelength of 180–300 nm to expose said film;

heating the resist film on the substrate to a temperature of 50°–120° C. prior to development; and developing the film, thus exposed, by the use of a solution of an acetic ester, an alkyl ketone or cyclohexanone and, in addition, water or a mixture of water and alcohol.

2. A process for forming patterns with a negative type resist as claimed in claim 1 wherein said developer is a solution containing any one of acetic ester, alkyl ketone and cyclohexanone.

3. A process for forming patterns with a negative type resist as claimed in claim 1 wherein said developer is a solution containing acetic ester or cyclohexanone and, in addition, water or water and alcohol.

4. A process for forming patterns with a negative type resist as claimed in claim 1 wherein said exposure comprises the steps of selectively exposing the resist film to far ultraviolet rays having a wavelength of 200–300 nm, and then exposing all the unexposed portions of said resist film, which have not yet been subjected to said selective exposure by means of said far ultraviolet rays, by means of ultraviolet rays having a wavelength longer than 300 nm.

5. A process for forming patterns with a negative type resist wherein a resist film formed on the surface of a substrate is exposed and said substrate with the resist film is heated to a temperature of 50°–120° C. and then developed in a solution of an acetic ester, an alkyl ketone or cyclohexanone and, in addition, water or a mixture of water and alcohol to form resist patterns, said exposure being carried out in such a manner that said resist film, made of a quinone diazide sulfonic ester novolak resin film, is subjected to blanket exposure by means of ultraviolet rays having a wavelength longer than 300 nm, and wherein the resist film, thus exposed, is further subjected to selective exposure by means of far ultraviolet rays having a wavelength of 300 nm or less.

* * * * *